United States Patent [19]
Nose et al.

[11] Patent Number: 5,751,426
[45] Date of Patent: May 12, 1998

[54] POSITIONAL DEVIATION MEASURING DEVICE AND METHOD FOR MEASURING THE POSITIONAL DEVIATION BETWEEN A PLURALITY OF DIFFRACTION GRATINGS FORMED ON THE SAME OBJECT

[75] Inventors: Noriyuki Nose, Atsugi; Minoru Yoshii, Higashinakano; Kenji Saitoh; Hiroshi Osawa, both of Yokohama; Koichi Sentoku, Atsugi; Toshihiko Tsuji, Atsugi; Takahiro Matsumoto, Atsugi, all of Japan

[73] Assignee: Canon Kabushiki Kaisha, Tokyo, Japan

[21] Appl. No.: 460,708

[22] Filed: Jun. 2, 1995

Related U.S. Application Data

[63] Continuation of Ser. No. 947,802, Sep. 21, 1992, abandoned.

[30] Foreign Application Priority Data

Sep. 27, 1991 [JP] Japan .................................. 3-276952

[51] Int. Cl.$^6$ ........................................ G01B 9/02
[52] U.S. Cl. ..................... 356/356; 356/363; 356/351; 356/401; 356/349
[58] Field of Search .................................. 356/349, 351, 356/356, 363, 400, 401; 250/571

[56] References Cited

U.S. PATENT DOCUMENTS

| | | | |
|---|---|---|---|
| 4,710,026 | 12/1987 | Magome et al. | 356/349 |
| 5,000,573 | 3/1991 | Suzuki et al. | 356/400 |
| 5,114,236 | 5/1992 | Matsugu et al. | |
| 5,142,156 | 8/1992 | Ozawa et al. | |
| 5,550,635 | 8/1996 | Saitoh et al. | 356/401 |

FOREIGN PATENT DOCUMENTS

0358425  3/1990  European Pat. Off.

*Primary Examiner*—Frank G. Font
*Assistant Examiner*—Robert Kim
*Attorney, Agent, or Firm*—Fitzpatrick, Cella, Harper & Scinto

[57] ABSTRACT

A device and method for measuring the positional deviation between a plurality of diffraction gratings formed on the same object include an illumination optical system for illuminating the plurality of diffraction gratings with a light beam, the illumination by the optical system generating a plurality of diffracted light beams from the plurality of diffraction gratings, an interference optical system for forming at least one interference light beam from the plurality of diffracted light beams, a detector for detecting the at least one interference light beam, the result of the detection serving as the basis for measuring the positional deviation between the plurality of diffraction gratings, and a measuring portion for measuring the relative positional relation between the illumination optical system and the plurality of diffraction gratings.

14 Claims, 10 Drawing Sheets

POSITIONAL DEVIATION MEASURING DEVICE AND METHOD FOR MEASURING THE POSITIONAL DEVIATION BETWEEN A PLURALITY OF DIFFRACTION GRATINGS FORMED ON THE SAME OBJECT

This application is a continuation of application Ser. No. 07/947,802 filed Sep. 21, 1992, now abandoned.

BACKGROUND OF THE INVENTION

1. Field of the Invention

The present invention relates to a positional deviation measuring device and a method thereof which are suitable for use as the positional deviation measuring device and method for measuring the positional deviation between superimposed patterns when fine electronic circuit patterns formed on objects (hereinafter referred to as reticles), such as a plurality of masks or reticles, are aligned with and printed on a second object, such as a wafer, by an exposure apparatus used for manufacturing semiconductor devices.

2. Description of the Related Art

In a semiconductor-manufacturing exposure apparatus for transferring circuit patterns on reticles onto the photosensitive member of a wafer using ultraviolet radiation or X-rays, relative positioning between the reticle and the wafer is an essential factor for increasing the performance of the apparatus. The positioning operation conducted by the currently used exposure apparatus requires a positioning accuracy of the order of, for example, a submicron or less, to achieve a high degree of integration of the semiconductor devices.

In many positioning devices, a so-called alignment pattern is provided on the reticle and on the wafer for positioning, and alignment between the reticle and the wafer is performed by utilizing the positional data obtained from the alignment patterns. The positioning performance of an exposure apparatus is conventionally measured and evaluated by printing the fine pattern formed on the reticle onto the wafer and then by visually measuring or measuring through an image processing operation the deviation between the pattern printed on the wafer and a pattern previously formed on the wafer.

However, the visual measuring method has drawbacks in that (1) the measurement accuracy thereof largely depends on the experience or skill of the operator and is thus unstable, (2) it requires time and is inconvenient because it is manually done, and (3) the measurement accuracy is low.

The measurement method based upon an image processing operation suffers from problems in that the technique thereof is complicated and requires a great deal of time, and in that a high measurement accuracy cannot be obtained.

SUMMARY OF THE INVENTION

It is an object of the present invention to overcome the deficiencies of the prior art.

It is another object of the present invention to provide a positional deviation measuring device which can automatically measure the positional deviation between superimposed patterns on an object.

It is still another object of the present invention to provide a positional deviation measuring device in which the measuring time for measuring the positional deviation between superimposed patterns is reduced.

It is still another object of the present invention to provide a positional deviation measuring device which assures high accuracy measurements of the positional deviation between superimposed patterns.

According to one aspect, the present invention which achieves at least one of these objectives relates to a device for measuring the positional deviation between a plurality of diffraction gratings formed on the same object, the device comprising an illumination optical system for illuminating the plurality of diffraction gratings with a light beam, the illumination by said illumination optical system generating a plurality of diffracted light beams from the plurality of diffraction gratings, an interference optical system for forming at least one interference light beam from the plurality of diffracted light beams, a detector for detecting the at least one interference light beam, wherein the result of the detecting by the detector serves as the basis for measuring the positional deviation between the plurality of diffraction gratings, and a measuring system for measuring the relative positional relation between the illumination optical system and the plurality of diffraction gratings.

The plurality of diffraction gratings can be two equidistant linear diffraction gratings. Also, the interference optical system can form two separate interference light beams from the diffracted light beams respectively generated from the two diffraction gratings. In addition, the measuring system comprises imaging means for imaging the plurality of diffraction gratings through the interference optical system.

The device can further comprise a light-receiving element for receiving a diffracted light beam which is generated from the at least one of the plurality of diffraction gratings by the illumination of the illumination optical system and which is not incident on the interference optical system, and means for measuring the relative positional relation between the interference optical system and the plurality of diffraction gratings from a position on the light-receiving element at which the diffracted light beam, which is not incident on the interference optical system, is incident. Also, the measuring system measures the rotational positional deviation about a direction perpendicular to the surface on the object on which the plurality of diffraction gratings are formed.

According to another aspect, the present invention which achieves at least one of these objectives relates to a method of measuring the positional deviation between a plurality of diffraction gratings formed on the same object, the method comprising the steps of illuminating the plurality of diffraction gratings with a light beam from an illumination optical system, the illumination generating a plurality of diffracted light beams from the plurality of diffraction gratings, forming at least one interference light beam from the plurality of diffracted light beams using an interference optical system, detecting at least one interference light beam, and using the result of the detecting to measure the positional deviation between the plurality of diffraction gratings, measuring the relative positional relation between the illumination optical system and the plurality of diffraction gratings, and aligning the illumination optical system with the object on the basis of the results of the measuring step, the illumination in the illuminating step being performed on the plurality of diffraction gratings which have been aligned in the alignment step.

The plurality of diffraction gratings can be two equidistant linear diffraction gratings. Also, the method can further comprise the step of forming separate interference light beams from the diffracted light beams respectively generated from the two diffraction gratings with the interference optical system. In addition, the measuring step comprises the step of using imaging means for imaging the plurality of diffraction gratings through the interference optical system.

The measuring step can further comprise the steps of receiving a diffracted light beam, which is generated from the at least one of the plurality of diffraction gratings by the illumination of the illumination optical system and which is not incident on the interference optical system, with a light receiving element, and measuring the relative positional relation between the interference optical system and the plurality of diffraction gratings from a position on the light-receiving element at which the diffracted light beam, which is not incident on the interference optical system, is incident. The measuring step can also comprise the step of measuring the rotational positional deviation about a direction perpendicular to the surface of the object on which the plurality of diffraction gratings are formed.

Other and further objects will be apparent from the following description of embodiments with reference to the accompanying drawings.

DETAILED DESCRIPTION OF THE PREFERRED EMBODIMENTS

A positional deviation measuring device according to the embodiments described below includes an illumination optical system for illuminating first and second grating patterns formed on an object with coherent light, an interference optical system for causing the diffracted light emanating from the first and second grating patterns to interfere with each other, a detecting portion for detecting the relative positional deviation between the first and second grating patterns by obtaining the phase difference between the interference light beams generated by the interference optical system, and a measuring portion for measuring the deviation between the illumination optical system and the first and second grating patterns.

In the positional deviation measuring device having the aforementioned structure, the first and second grating patterns are illuminated with coherent light, and the diffracted light beams emanating from the first and second grating patterns are caused to interfere with each other to detect the relative positional deviation between the first and second grating patterns. Also, the deviation between the first and second grating patterns and the illumination optical system is measured.

Figure 1:
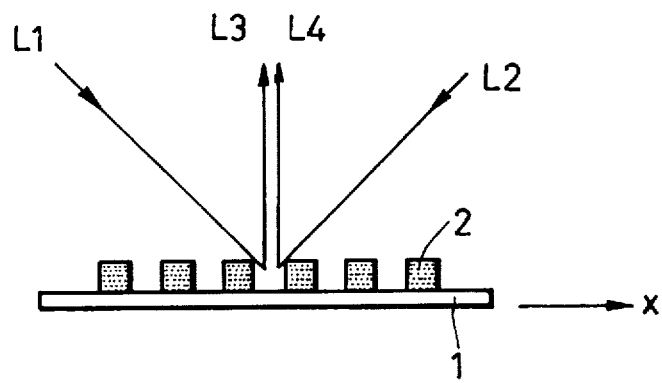
FIG. 1 illustrates the principle of the present invention.

The principle of measurement of the positional deviation will be described in detail. FIG. 1 illustrates how an equidistant linear diffraction grating 2 whose grating lines extend in a direction perpendicular to the surface of the page on which FIG. 1 is printed is illuminated with laser beams L1 and L2, which are plane waves having an angle of incidence of the same absolute value and slightly different frequencies. Where m is the number of the order of the diffracted light, a diffracted light of the +mth order is the diffracted light located to the left of the direction of propagation of the diffracted light of the zeroth order, and a diffracted light of the − mth order is the diffracted light located to the right of the direction of propagation of the diffracted light of the zeroth order. The diffracted light of − first order produced from the light beam L1 by the diffraction grating 2 is directed perpendicular to the surface of the wafer 1.

It is a known fact that when the diffraction grating 2 moves by distance equal to the pitch of the diffraction grating 2 in the x direction, the phase of the wave fronts of the diffracted light beams L3 and L4 produced from the light beams L1 and L2 by the diffraction grating 2 having a pitch p varies by $2\pi$, i.e., by the single wavelength. That is, when the diffraction grating 2 shifts in the x direction by XO, a phase change of $\pm 2m\pi XO/p$ occurs in the diffracted light.

Figure 2:
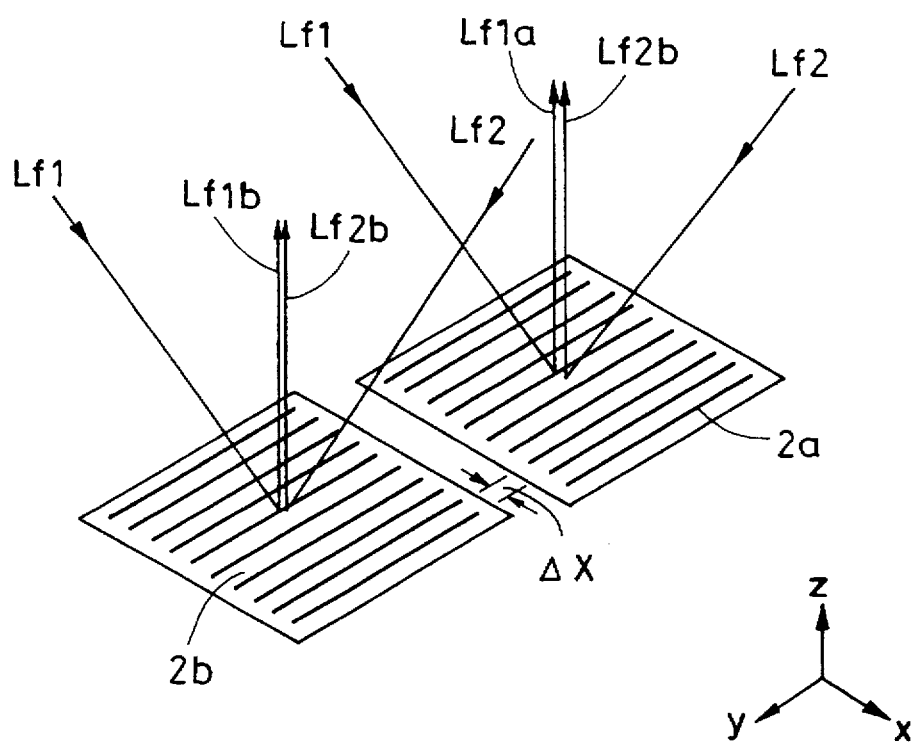
FIG. 2 illustrates how a light beam is incident on a diffraction grating.

A method of measuring the deviation between the printed patterns using the above-described principle will be described below. As shown in FIG. 2, we consider two equidistant linear diffraction gratings (gratings) 2a and 2b located adjacent to each other in the same plane. The two diffraction gratings 2a and 2b have the same pitch p. There is a deviation ($\Delta x = Xb - Xa$) in the x direction between the diffraction gratings 2a and 2b. Xa and Xb are respectively deviations of the diffraction gratings 2a and 2b in the x direction from the same reference position.

The complex amplitudes Uf1 and Uf2 of the two light beams Lf1 and Lf2 having slightly different frequencies ($\omega f1$, $\omega f2$) and initial phases $\phi f1$ and $\phi f2$ are given by the following equations (1) and (2), respectively.

$$Uf1 = AO \exp\{i(\omega f1 t + \phi f1)\} \quad (1)$$

$$Uf2 = BO \exp\{i(\omega f2 t + \phi f2)\} \quad (2)$$

AO and BO are constants which can be easily determined experimentally.

The entire surface of the two diffraction gratings 2a and 2b is illuminated with the two light beams Lf1 and Lf2. The light beams Lf1 and Lf2 are projected from, for example, the left and right sides at angles of incidence of the same absolute value, respectively. Diffracted light beams of + first order produced from the light beam Lf1 by the diffraction gratings 2a and 2b are indicated by Laf1 and Lbf1, respectively. Diffracted light beams of − first order produced from the light beam Lf2 by the diffraction gratings 2a and 2b are indicated by Laf2 and Lbf2, respectively. Complex amplitudes Uaf1(+1), Uaf2(−1), Ubf1(+1) and Ubf2(−1) of the diffracted light beams Laf1, Laf2, Lbf1 and Lbf2 are respectively expressed by the following equations (3) through (6):

$$U_{af1}(+1) = Af1 \exp\{i(\omega_{f1}t + \phi_{f1} + 100 a)\} \quad (3)$$

$$U_{af2}(-1) = Af2 \exp\{i(\omega_{f2}t + \phi_{f2} + \phi a)\} \quad (4)$$

$$U_{bf1}(+1) = Bf1 \exp\{i(\omega_{f1}t + \phi_{f1} + \phi b)\} \quad (5)$$

$$U_{bf2}(-1) = Bf2 \exp\{i(\omega_{f2}t + \phi_{f2} + \phi b)\} \quad (6)$$

Af1, Af2, Bf1 and Bf2 are constants which can be determined experimentally.

Here, we have $\phi a = 2\pi X a/p$ and $\phi b = 2\pi X b/p$. In these equations, the amounts of deviation of the diffraction gratings 2a and 2b in the x direction are expressed in the form of a phase. The intensity distributions Ua and Ub of the interference light beams obtained by interfering the diffracted light beams Laf1 and Laf2 produced by the diffraction grating 2a and the diffracted light beams Lbf1 and Lbf2 produced by the diffraction gratings 2b, respectively, are given by the following equations (7) and (8):

$$\begin{aligned}Ua &= |U'_{af1}(+1) + U'_{af2}(-1)|^2 \quad (7)\\ &= Af1^2 + Af2^2 + 2Af1 \cdot Af2 \cos\{2\pi(f2-f1)t + (\phi f2 - \phi f1) - 2\phi a\}\end{aligned}$$

$$\begin{aligned}Ub &= |U'_{bf1}(+1) + U'_{bf2}(-1)|^2 \quad (8)\\ &= Bf1^2 + Bf2^2 + 2Bf1 \cdot Bf2 \cos\{2\pi(f2-f1)t + (\phi f2 - \phi f1) - 2\phi b\}\end{aligned}$$

where $Af1^2 + Af2^2$ and $Bf1^2 + Bf2^2$ are a d.c. component, and $2Af1 \cdot Af2$ and $2Bf1 \cdot Bf2$ are an amplitude, and $U'af1(+1)$, $U'af2(-1)$, $U'bf1(+1)$, and $U'bf2(-1)$ are complex amplitudes of diffracted light beams Laf1, Laf2, Lbf1 and Lbf2, respectively.

The signals indicated by equations (7) and (8) are those having a beat frequency of f2–f1 and an initial phase difference of $\phi f2 - \phi f1$ and which have been phase modulated by deviations $\phi a$ and $\phi b$ of the diffraction gratings 2a and 2b, respectively. Thus, the initial phases of the light beams can cancel each other and a phase difference $\Delta\phi = \phi b - \phi a = (2\pi/p)\Delta x$ can be detected with a high degree of accuracy by the so-called heterodyne interference method by using either one of the signals expressed by equations (7) and (8) as a reference signal while employing the other one as a signal to be measured and by detecting the time deviation between the two signals.

Figure 3:
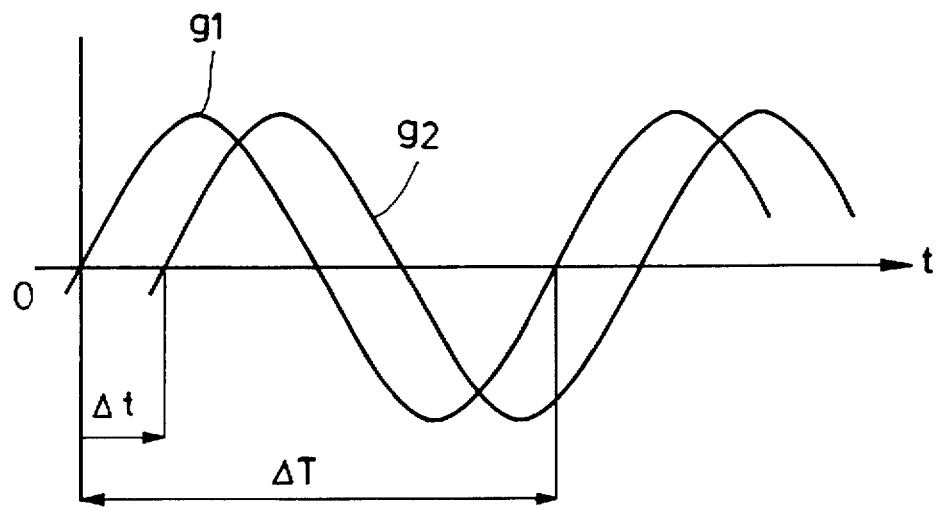
FIG. 3 illustrates a phase shift between a reference signal and a signal to be measured.

As mentioned above, the heterodyne interference method is a method which detects the phase difference between the two signals over time. Therefore, the detection is not affected by a difference in the d.c. components of the signals or a change in the amplitudes thereof. If the time difference between a reference signal g1 and a signal to be measured g2 is indicated by $\Delta t$, as shown in FIG. 3, the phase difference between the two signals can be measured with a high degree of accuracy by accurately detecting time difference $\Delta T$ by using, for example, a lock-in amplifier.

Since the thus-detected phase difference corresponds to the phase difference $\Delta\phi$ representing the deviation between the diffraction gratings 2a and 2b, the deviation between the diffraction gratings 2a and 2b can be obtained from p'$\Delta\phi/2\pi$. Thus, the positioning accuracy of the semiconductor device exposure apparatus, i.e., the positional deviation between the device pattern printed in the first exposure operation and that printed in the second exposure apparatus, can be detected by obtaining the deviation between the grating pattern (which may be 2a) printed in the first exposure operation and the grating pattern (which may be 2b) printed in the second exposure operation on the basis of the aforementioned principle.

Figure 4:
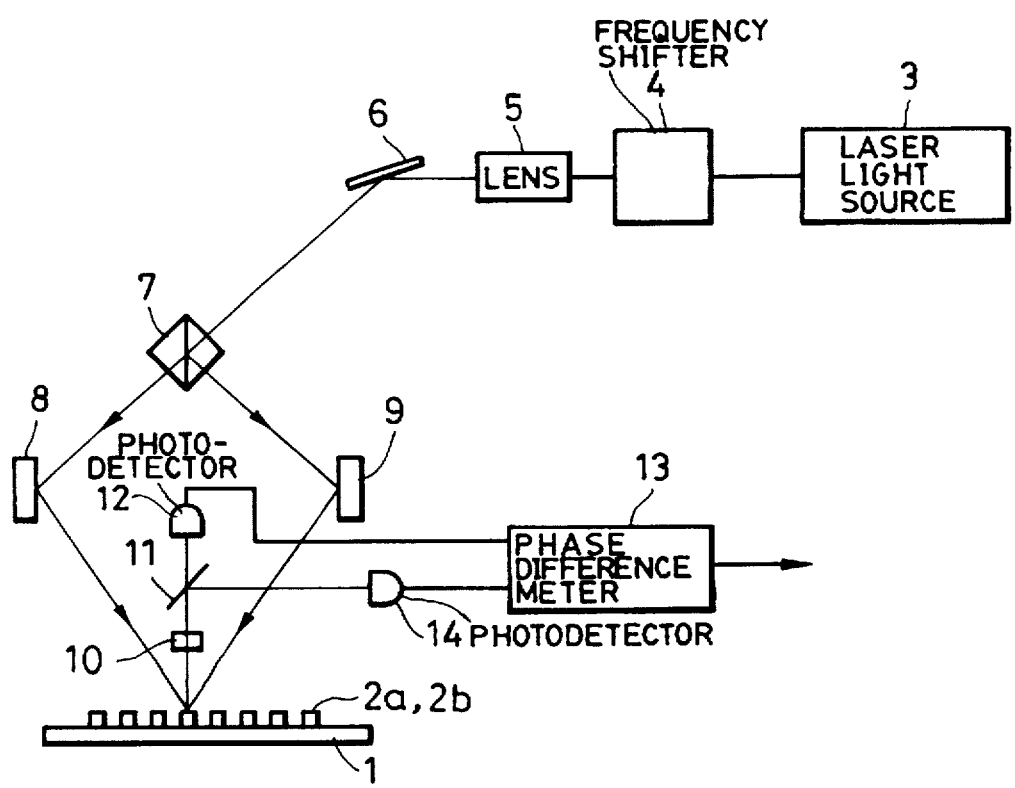
FIG. 4 illustrates a schematic view of the structure of a measuring device.
Figure 5:
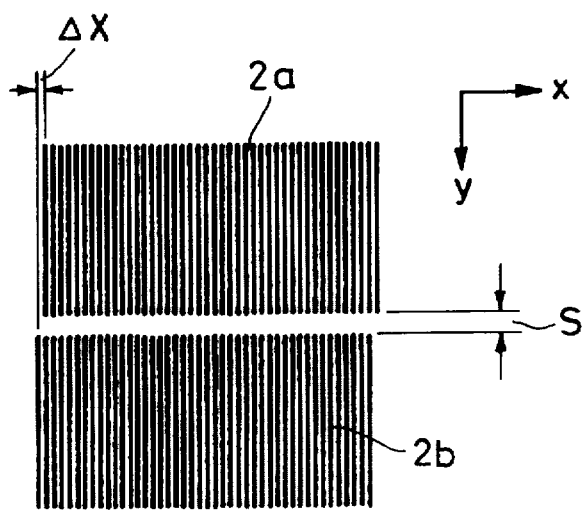
FIG. 5 is a plan view of diffraction gratings on a wafer.
Figure 6:
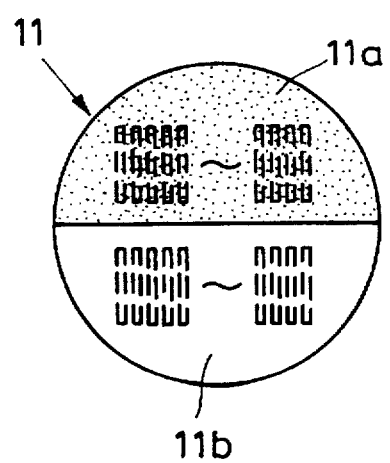
FIG. 6 is a front view of an edge mirror.

FIG. 4 illustrates the structure of the measuring device which adopts the aforementioned measurement method. In an optical path of a laser beam emanating from a laser light source 3 are disposed a frequency shifter 4, a lens 5, a mirror 6 and a polarization beam splitter 7. In each of optical paths of the laser beams split by the polarization beam splitter 7, a mirror 8 or 9 is provided to direct the laser beam toward a wafer 1. Two diffraction gratings 2a and 2b are provided on the upper surface of the wafer 1 in such a manner that the grating lines thereof are parallel to each other, as shown in FIG. 5. In an optical path of a light reflected by the wafer 1, a Glan-Thompson prism 10, an edge mirror 11 consisting of a mirror portion 11a and a glass portion 11b, and a photodetector 12 which is a photoelectric conversion device, such as an avalanche photo-diode, are disposed in that order. The output of the photodetector 12 is connected to a phase difference meter 13 which may be a lock-in amplifier. In an optical path of light reflected by the edge mirror 11, a photodetector 14, which is similar to the photodetector 12, is provided. The output of the photodetector 14 is connected to the phase difference meter 13.

The frequency shifter 4 produces two light beams Lf1 (→) and Lf2 (O) whose planes of polarization are perpendicular to each other and which have slightly different frequencies f1 and f2 from the light emanating from the laser light source 3. The arrow in parenthesis indicates a p-polarized light beam, and the O in parenthesis indicates an s-polarized light beam. The two light beams Lf1 (→) and Lf2 (O) present on the common optical path are narrowed by the lens 5. The mirror 6 changes the direction of propagation of the narrowed light beams. The polarization beam splitter 7 separates the light beams Lf1 (→) and Lf2 (O) incident thereon in two directions due to a difference in the direction of polarization. The separated two light beams are reflected by the mirrors 8 and 9, respectively, and are then projected onto the entire surface of the diffraction gratings 2a and 2b on the wafer 1 at angles of incidence of the same absolute value.

Figure 7:
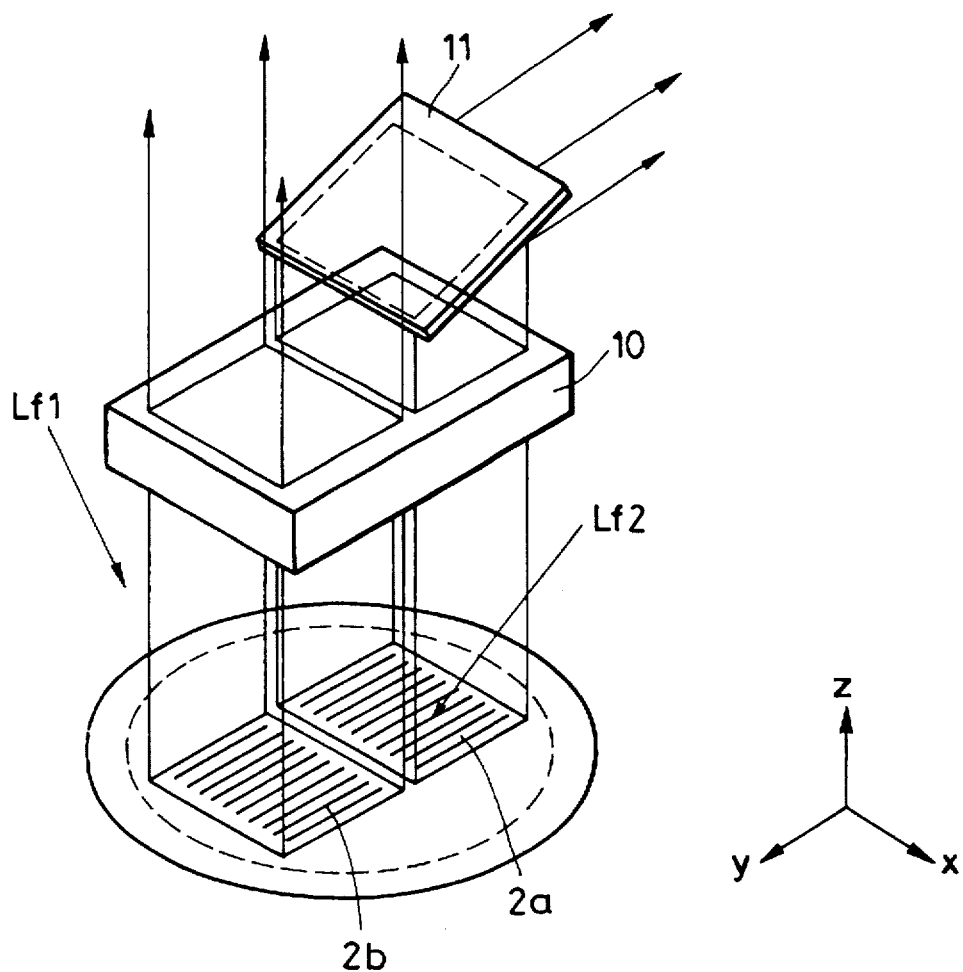
FIG. 7 is a perspective view of a rotational interference optical system.
Figure 8:
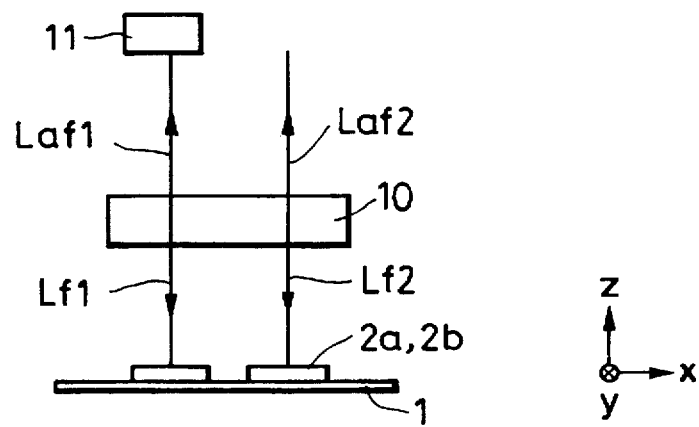
FIG. 8 is a side elevation view of a rotational interference optical system.

FIG. 7 is a perspective view of an optical system for diffracting light incident thereon. FIG. 8 is a side elevational view of the optical system. In FIGS. 7 and 8, illustration of the glass portion of the edge mirror 11 is omitted. The light beams Lf1 and Lf2 are made incident on the wafer 1 from the right and left thereof at the same angle with respect to the normal to the surface of the wafer 1 to illuminate the wafer 1. In FIG. 7, the diffracted light beam Laf1 of the + first order produced from the light beam Lf1 incident on the diffraction grating 2a from the left is superimposed on the diffracted light beam Laf2 of the – first order produced from the light beam Lf2 incident on the diffraction grating 2a from the right by the passage thereof through the Glan-Thompson prism 10 which produces a linearly polarized light and causes the diffracted light Laf1 of the +first order to interfere with the diffracted light Laf2 of the –first order. Similarly, the diffracted light beam Lbf1 of the + first order produced by the diffraction grating 2b from the light beam Lf1 is superimposed on the diffracted light beam Lbf2 of the – first order produced by the diffraction grating 2b from the light beam Lf2 so that the two beams interfere with each other.

The interference light beams S1 and S2 obtained by interference of the beams noted above contain the phase terms representing the deviations from the initial phases of the diffraction gratings 2a and 2b. The interference signals are expressed by equations (7) and (8).

That is, equation (7) represents a signal obtained when the diffracted light beams Laf1 and Laf2 interfere with each other, and equation (8) represents a signal obtained when the diffracted light beams Lbf1 and Lbf2 interfere with each other. 2φa and 2φb are the phase terms which represent the deviations of the diffraction gratings 2a and 2b. The interference light beams S1 and S2 corresponding to the diffraction gratings 2a and 2b and obtained by the Glan-Thompson prism 10 deviate from each other according to the layout of the diffraction gratings 2a and 2b. The edge mirror 11 spacially directs the interference light beams S1 and S2 into two directions. The photodetectors 12 and 13 convert the separated interference light beams S1 and S2 into electrical signals. The obtained electrical signals are input to the phase difference meter 13.

If the pitch, p, of the diffraction gratings 2a and 2b is 2 μm and if the wavelength λ of the light emanating from the light source 3 is 0.6328 μm, diffracted light beams Laf1, Laf2, Lbf1 and Lbf2 of the ± first order are diffracted in the upward direction perpendicular to the wafer 1, when the angle of incidence θ (±1) of the light beams Lf1 and Lf2 with respect to the diffraction gratings 2a and 2b is given by the following equation:

$$\theta(\pm 1)=\sin(m\lambda/p) \text{ (where m is the number of the order of the diffracted light)} \quad (9)$$

From the above equation, we have θ (±1)=sin⁻¹ (0.6328/2)=18.4°

In the aforementioned measurement operation, a phase difference of λ/1000 corresponds to a positional deviation between the diffraction gratings 2a and 2b of 0.001 μm.

FIG. 7 illustrates an example of the detection operation of the positional deviation which utilizes the diffracted light beams of ± first order produced by the diffraction gratings 2a and 2b. However, diffracted light beams of higher orders (of the ±mth order, where m=2, 3, 4, . . . ) can also be used for such measurements. In such a case, the mirrors 8 and 9 shown in FIG. 4 are shifted such that the diffracted light beams of the higher orders are directed in the upward direction perpendicular to the wafer 1. The use of the diffracted light beams of the higher orders increases the sensitivity with which the phases representing the deviations of the diffraction gratings 2a and 2b in the x direction are obtained. The use of the diffracted light of, for example, the ±mth order increases the sensitivity by a factor of m, as compared with the case in which the diffracted light of ± first order is used.

If the pitch of the diffraction gratings 2a and 2b is 2 μm and if the wavelength λ of the light emanating from the light source 3 is 0.6328 μm, as in the case shown in FIG. 7, diffracted light beams of the ± second order are directed in the upward direction perpendicular to the wafer 1, when the angle of incidence θ (±2) of the light beams with respect to the diffraction gratings 2a and 2b is given by the following equation:

$$\theta(\pm 2)=\sin(2\times 0.6388/2)=39.3° \quad (10)$$

Similarly, when the diffracted light beams of the ± third order are used, the angle of incidence is set to a value given by the following equation:

$$\theta(\pm 3)=\sin(2\times 0.6388/2)=71.7° \quad (11)$$

When diffracted light beams of the ±mth order are used for the positional deviation measurements, the phase terms φam and φbm corresponding to φa and φb in equations (3) through (6) are expressed as follows:

$$\phi am=2m\pi Xa/p \quad (12)$$

$$\phi bm=2m\pi Xb/p \quad (13)$$

Thus, the deviation between the diffraction gratings 2a and 2b is expressed in terms of the phase as follows:

$$2(\phi bm-\phi am)=(4m\pi/p)\cdot(Xb-Xa) \quad (14)$$

In the device shown in FIG. 4, no image forming lens, which ensures that the area on the wafer 1 illuminated with the light beams Lf1 and Lf2 and the photodetector 12 are conjugate, exists. In that case, the light beam may be dispersed by diffraction between the diffraction gratings 2a and 2b on the wafer 1 and the photodetector 12 and the degree to which it has a diameter larger than the aperture of the photodetector 12, the efficiency of the photodetector 12 is reduced. This problem may be solved by providing an image forming lens between the Glan-Thompson prism 10 and the area on the wafer 1 illuminated with the light beam or between the Glan-Thompson prism 10 and the edge mirror 11.

Figure 9:
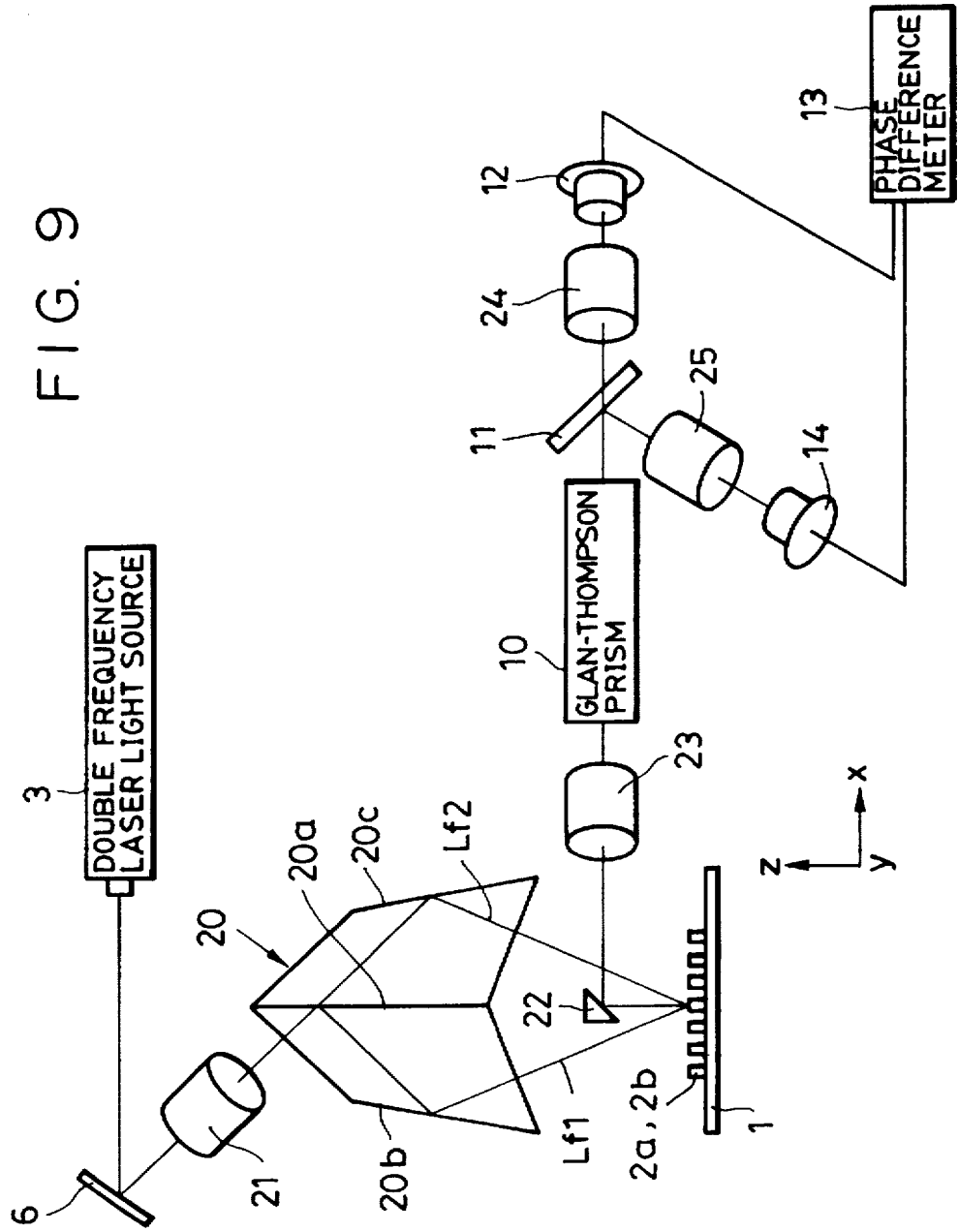
FIG. 9 illustrates a schematic view of the structure of the essential parts of a first embodiment according to the present invention.

The layout of such a device will be described below with reference to FIG. 9 which illustrates the structure of the essential parts of a first embodiment of the present invention. As a result, the same reference numerals used in FIG. 4 are used in FIG. 9 to denote identical elements in FIG. 4. In the structure shown in FIG. 9, an interference prism 20, having a polarization beam splitter 20a and reflecting surfaces 20b and 20c, is provided in place of the polarization beam splitter 7 and mirrors 8 and 9 shown in FIG. 4. A lens 21 is provided between a mirror 6 and the interference prism 20, and a mirror 22 and a lens 23 are provided between a wafer 1 and a Glan-Thompson prism 10. Lenses 24 and 25 are disposed between an edge mirror 11 and a photodetector 12 and between the edge mirror 11 and a photodetector 14, respectively. The diffraction gratings 2a and 2b and the edge mirror 11 are conjugate with respect to the lens 23. The edge mirror 11 and the apertures of the photodetectors 12 and 14 are conjugate with respect to the lenses 24 and 25, respectively.

The light beams Lf1 and Lf2 having two frequencies f1 and f2, respectively, and emanating from a double-frequency laser light source 3 pass through the mirror 6 and then the lens 21 and reach the interference prism 20. After the light beams Lf1 and Lf2 pass through the polarization beam splitter 20a and reflection surfaces 20b and 20c of the interference prism 20, they are incident on the diffraction gratings 2a and 2b on the wafer 1 which diffract the light beam Lf1 whose plane of linear polarization is perpendicular to the surface of the paper on which FIG. 9 is drawn and the light beam Lf2 whose plane of linear polarization is parallel to the surface of the paper on which FIG. 9 is drawn. The diffracted light beams are reflected from the mirror 22 and pass through the lens 23 and then the Glan-Thompson prism 10 and pass through or are reflected by the edge mirror 11 and then reach the photodetectors 12 and 14.

To illuminate the diffraction gratings 2a and 2b on the wafer 1 with the light beams emanating from the laser light source 3 efficiently in terms of the quantity of light, the diameter of the light beams emitted from the laser light source 3 must be adjusted according to the size of the diffraction gratings 2a and 2b. To illuminate the diffraction gratings 2a and 2b with a light beam having a desired diameter through the lens 21 having an adequate F No., the lens 21 is disposed such that the focal point thereof is on the diffraction gratings 2a and 2b.

Regarding the layout of the wafer 1 and the optical system, it is desirable to place restrictions on the alignment between the wafer 1 and the optical system. If these restrictions are ignored, detection errors increase. The details of the restrictions will be described below with reference to FIG. 9 in terms of the relationship between the alignment conditions and physical quantities associated therewith.

(1) Translation in the x axis direction of the wafer (a) If sufficient relative positional deviation between the wafer and the edge of the edge mirror 11 occurs in the x axis direction, optical cross-talk occurs in the photodetectors 12 and 14.

(b) If the center of the beam striking the diffraction gratings 2a and 2b deviates from the ideal position in the x axis direction, the quantity of light illuminating the diffraction gratings is reduced.

(2) Translation in the y axis direction of the wafer

The same relationships as those described in (a) and (b) of (1) obtain.

(3) Translation in the z axis direction of the wafer (a) Regarding the lens 23, if de-focusing occurs in the z axis direction between the diffraction gratings 2a and 2b and the edge mirror 11, blurring of the edge and generation optical cross-talk in the photodetectors 12 and 14 will occur.

(b) Since the wafer is illuminated obliquely, the center of the light beam striking the diffraction gratings 2a and 2b deviates from the ideal position, thus reducing the quantity of light striking the diffraction gratings.

(4) Rotation σx about the x axis (a) The ideal condition is that the direction in which the light beam Lf1 is diffracted by the diffraction gratings 2a and 2b and the direction in which the light beam Lf2 is diffracted by the diffraction gratings 2a and 2b are the same. Such a condition is referred to as a one color condition because interference fringes having uniform intensity over the entire surface are obtained under that condition. A rotation σx about the x axis of the direction of light beam Lf1 with respect to light beam Lf2 violates the one color condition, and reduces the amplitude of the variations in the intensity of light detected by the photodetectors 12 and 14 and hence reduces the phase detection capability thereof.

(b) A rotation σx about the x axis changes variations in the phase shift of the light beams Lf1 and Lf2 generated by the diffraction gratings 2a and 2b.

(5) Rotation σy about the y axis

The same relationships as those described in (a) and (b) of (4) are obtained.

(6) Rotation σz about the z axis

The same relationships as those described in (a) and (b) of (4) are obtained.

Quantitative examples of the above-mentioned relationships between the alignment conditions and the physical quantities associated therewith will be given as follows:

(1) Translation in the x axis direction of the wafer (a) Since the x direction is parallel to the edge of the edge mirror 11, normal deviation in the x axis direction between the wafer and the edge of the edge mirror 11 causes minimal cross-talk between signals produced by the photodetectors 12 and 14 that is within acceptable limits.

(b) If the total size of the diffraction gratings 2a and 2b is, for example, 120 μm×120 μm and if the diameter of the illuminated light beam is 200 μm, the maximum acceptable translation in the x axis direction at which the intensity of light is reduced by 1/10 is less than 120 μm or between 100 μm and 120 μm.

(2) Translation in the y axis direction of the wafer (a) Since the y direction is perpendicular to the edge of the edge mirror 11, the maximum acceptable translation in the y axis direction is determined by the spacing S between the diffraction gratings 2a and 2b, shown in FIG. 5. If S=50 μm, if it is assumed that the lens 23 projects the diffracted light beams produced by the diffraction gratings 2a and 2b onto the edge mirror 11 so that the image of the patterns on the gratings 2a and 2b is the same size as the patterns on the gratings (i.e., a life-size image), and if the F No. of the lens 23 is 3, the maximum acceptable translation in the y axis direction is given by 50 (S)/2−2 μm (blurring caused by diffraction)=23 μm with the blurring caused by diffraction taken into consideration.

(b) Under the same conditions as that described in (b) of (1), the maximum acceptable translation in the y axis direction is from 50 to 60 μm.

(3) Translation in the z axis direction of the wafer (a) Regarding the lens 23, assume that de-focusing occurs in the z-axis direction between the diffraction gratings 2a and 2b and the edge mirror 11. At that time, if the effective F No. of the lens 23, which forms a life-size image at the edge mirror 11 of the patterns on the diffraction gratings 2a and 2b is 6, the maximum acceptable translation in the z axis direction which ensures that no optical cross-talk occurs in the photodetectors 12 and 14 is 100 μm to 150 μm.

(b) If the angle of incidence θ of the light illuminating the wafer 1 is $\sin^{-1}$ (0.6328/2 μm)=18.4°, if the pitch of the diffraction gratings 2a and 2b on the wafer 1 is 2 μm, and if the wavelength of light emitted from source 3 is 6328 Å, de-focusing occurring between diffraction gratings 2a and 2b and the edge mirror 11 by an amount ΔZ in the z axis direction shifts the center of the light beam illuminating the diffraction gratings 2a and 2b in the x direction by ΔZ tan 18.4°=0.33 ΔZ. If the maximum acceptable deviation in the z axis direction which ensures a reduction in the quantity of light by 1/10 is 100 μm, 0.22 ΔZ≦100 μm, that is, ΔZ≦300 μm.

(4) Rotation σx about the x axis (a) The maximum acceptable rotation σx about the x axis which assures the one color condition is sufficiently large that the typical or normal rotation σx about the x axis is within the maximum acceptable rotation.

(b) The maximum acceptable rotation σx about the x axis which causes acceptable variations in the phase shift is sufficiently large that the typical or normal amount of rotation σx about the x axis is within the maximum acceptable rotation.

(5) Rotation σy about the y axis (a) The maximum acceptable rotation σy about the x axis which assures the one color condition is 64.5 m rad=3.7, if the aperture of the photodetectors 12 and 14 is 240 μmφ.

(b) The maximum acceptable variation in the phase shift is sufficiently large that the typical or normal amount of rotation σy about the y axis is within the maximum acceptable rotation σy that causes the maximum acceptable variations in the phase shift.

(6) Rotation σz about the z axis (a) The maximum acceptable rotation σz about the z axis which assures the one color condition is 20.5 m rad=1.17°.

(b) The maximum acceptable rotation σz about the z axis which causes acceptable variations in the phase shift is 0.05 m rad.

The above-described quantitative examples are summarized in the following table.

TABLE 1

| Alignment condition | Maximum acceptable deviation factor | Tolerance |
| --- | --- | --- |
| x (Translation) | (a) Sufficiently large that the typical or normal deviation that occurs is within the maximum acceptable (b) 100–120 μm | Up to 100 μm |
| y (Translation) | (a) 23 μm (b) 50–60 μm | 23 μm |
| z (Translation) | (a) 100–150 μm (b) 300 μm | Up to 100 μm |
| σx | (a) Sufficiently large that the typical or normal deviation that occurs is within the maximum acceptable deviation (b) Sufficiently large that the typical or normal deviation that occurs is within the maximum acceptable deviation | Sufficiently large that the typical or normal deviation that occurs is within the maximum acceptable deviation |
| σy | (a) 3.7° (b) Sufficiently large that the typical or normal deviation that occurs is within the maximum acceptable deviation | 3.7° |
| σz | (a) 1.17° (b) Up to 10" | Up to 10" |

As can be seen from Table 1, the tolerances of the translations in the plane of the wafer 1 are small, and restrictions on these alignment conditions within these tolerances are essential to increase detection accuracy. In this embodiment, the alignment conditions are set within these tolerances by detecting the individual alignment conditions and by aligning the optical and detection system with the object to be detected on the basis of a detection signal.

Figure 10:
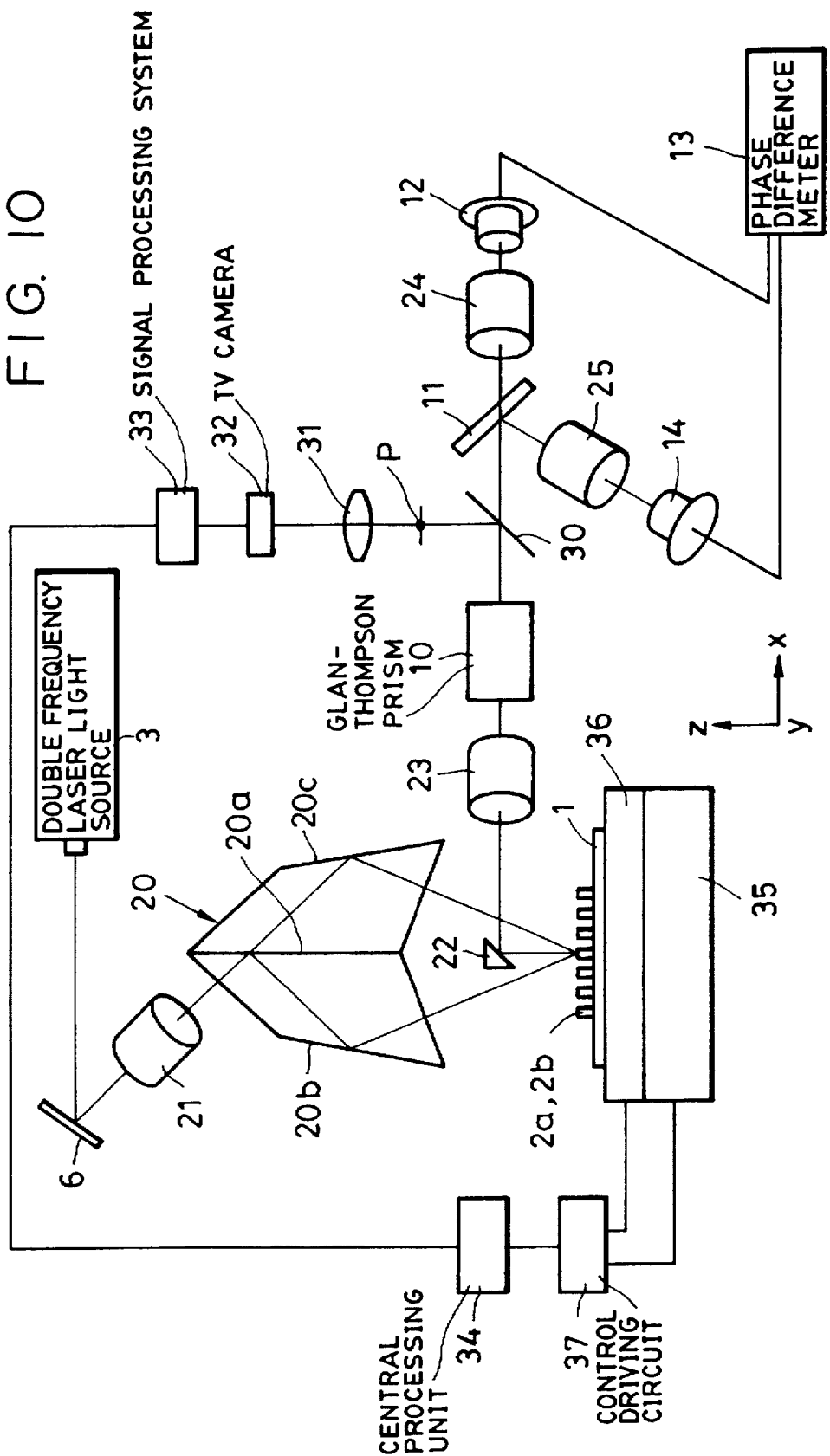
FIG. 10 illustrates a schematic view of the overall structure of the first embodiment.

FIG. 10 illustrates the entire structure of the first embodiment according to the present invention. In addition to the components shown in FIG. 9, a half mirror 30 is provided in advance of the edge mirror 11 so as to direct the diffracted lights produced by the diffraction gratings 2a and 2b toward a TV camera 32 through a lens 31 provided in the direction of reflection of the half mirror 30. Images of the diffraction gratings 2a and 2b are formed on a surface P by the lens 23 and are then formed on the TV camera 32 by the lens 31. The output of the TV camera 32 is connected to a signal processing system 33. The output of the signal processing system 33 is connected to a central processing unit (CPU) 34. The aforementioned structure enables the operator to know the extent to which the images on the diffraction gratings 2a and 2b on the wafer 1 deviate from the normal positions on the x, y and z planes with respect to the detection optical system. The wafer 1 is driven in the x axis direction by a stage 35 and is driven in the y axis direction by a stage 36. A command signal of the CPU 34 is transmitted to the stages 35 and 36 as well as to a z axis direction driving system (not shown) through a control driving circuit 37.

Figure 11:
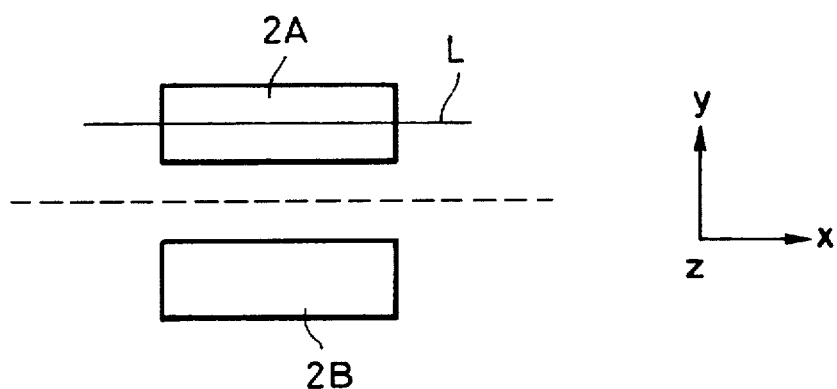
FIG. 11 illustrates the images of diffraction gratings on a TV screen.

FIG. 11 illustrates images 2A and 2B of the diffraction gratings 2a and 2b obtained on a TV screen (not shown). On the TV screen connected to the TV camera 32, the areas where the diffraction gratings 2a and 2b are present are displayed as bright images 2A and 2B. Thus, deviation of the position of the specified grating area on the wafer 1 from a desired position in x, y and z directions can be detected from the images 2A and 2B displayed on the TV screen.

For example, the correct pattern position on the wafer 1 is obtained using the image formed by the TV camera 32 during the assembly of the apparatus, and the position of the TV image is determined using coordinates on the TV screen. The deviation of the pattern printed on the wafer 1 from a desired position (the measured position) can be obtained by obtaining the coordinate of the position of the diffraction gratings 2a and 2b on the TV screen each time the pattern printed on the wafer 1 is driven by the stages 35 and 36.

If a charged coupled device (CCD) is used as the TV camera 32 and if it is assumed that the images of the diffraction gratings 2a and 2b are formed on the CCD at a magnification of 10 by the lens 31, the size of a single pixel of the CCD which is 10 μm×10 μm corresponds to the size of a 2 μm×2 μm area on the wafer 1. It is thus possible to calculate the deviation in the x and y plane direction to an accuracy of 2 to 3 μm using an image memory.

The CPU 34 gives an instruction to the stages 35 and 35 through the control driving circuit 37 on the basis of the obtained deviation to move the wafer 1 to the desired position. Consequently, the printed diffraction gratings 2a and 2b can be set at the correct position with respect to the laser optical system for detection, and the detection accuracy can thus be enhanced.

Figure 12A:
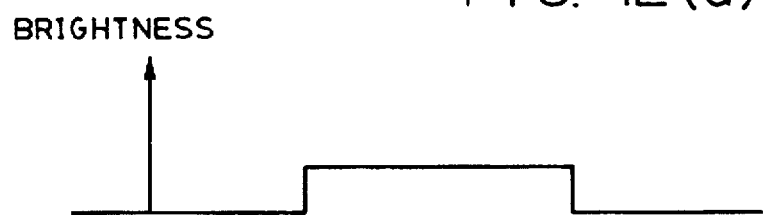
FIGS. 12(a) and 12(b) illustrate the intensity distribution of a TV scanning line.
Figure 12B:
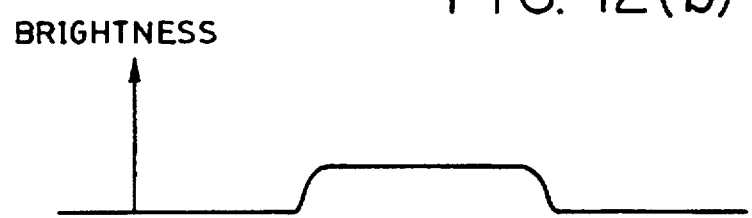

Detection of the deviation of the wafer 1 from a predetermined position in the z direction can be performed by detecting, for example, the intensity distribution of the TV image shown in FIG. 11 using a scanning line L. FIGS. 12(a) and 12(b) illustrate the intensity distribution at a cross-section of the TV screen. In the intensity distribution of the scanning line obtained when the diffraction gratings 2a and 2b deviate in the z direction, the edges representing the boundaries between the area of the diffraction gratings 2a and 2b and another area are not sharp, as shown in FIG. 12(b). FIG. 12(a) illustrates the intensity distribution of the scanning line obtained when the diffraction gratings 2a and 2b are located at the normal position in the z direction. As shown in FIG. 12(a), the edges are sharp. It is thus possible to obtain the deviation in the z direction by obtaining the sharpness of the edges, i.e., the maximum value of the differential coefficient of the intensity distribution. The CPU gives an instruction to the stage for driving the wafer in the z direction (not shown) on the basis of the obtained deviation to move the stage to a desired position in the z direction.

At that time, the driving in the z direction may be achieved by moving the interference prism 20 shown in FIG. 10 alone in the z direction or by driving a common base on which the laser light source 3, the lens 21 and the interference prism 20 are placed in the z direction. Alternately, a stage for driving the wafer 1 in the z direction provided separately from the stages 35 and 36 may be driven to move the wafer 1.

Figure 13:
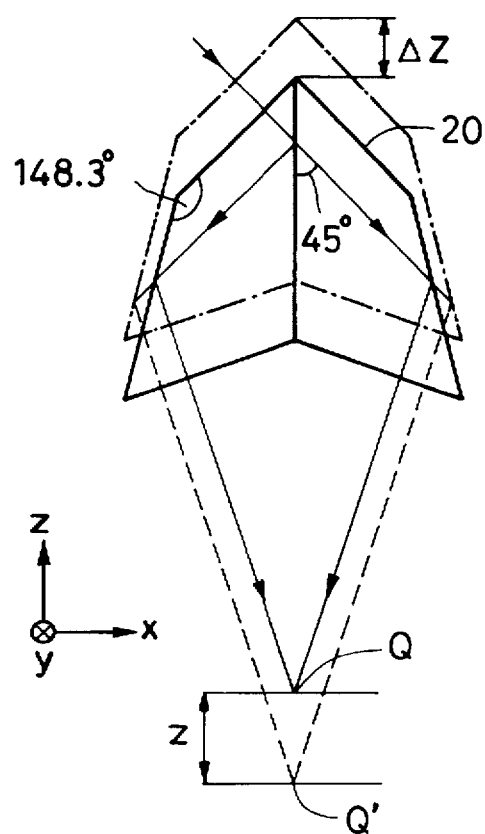
FIG. 13 illustrates a schematic view of the case in which a prism is shifted.

FIG. 13 illustrates extent to which the interference position on the wafer 1, i.e., the position of the interference light beams S1 and S2 on the wafer 1, shifts in the z direction when the interference prism 20 is shifted in the z direction by ΔZ. In this example, an internal angle of the reflection surfaces 20b and 20c of the prism 20 is 148.3° and light beams from the source 3 transmitted and reflected by beam splitter 20a from a 45° angle therewith. When the prism indicated by the solid line is moved in the z direction to a position indicated by an alternate long and short dash line, point Q moves to Q', and δ=1.777·ΔZ. That is, to shift the surface of the wafer 1 in the z direction by 54 μm, the interference prism 20 must be shifted in the z direction by Δ=100/1.777=56.3 μm. Point Q and point Q' are the points at which the beams from prism 20 are incident on the wafer 1.

Figure 14:
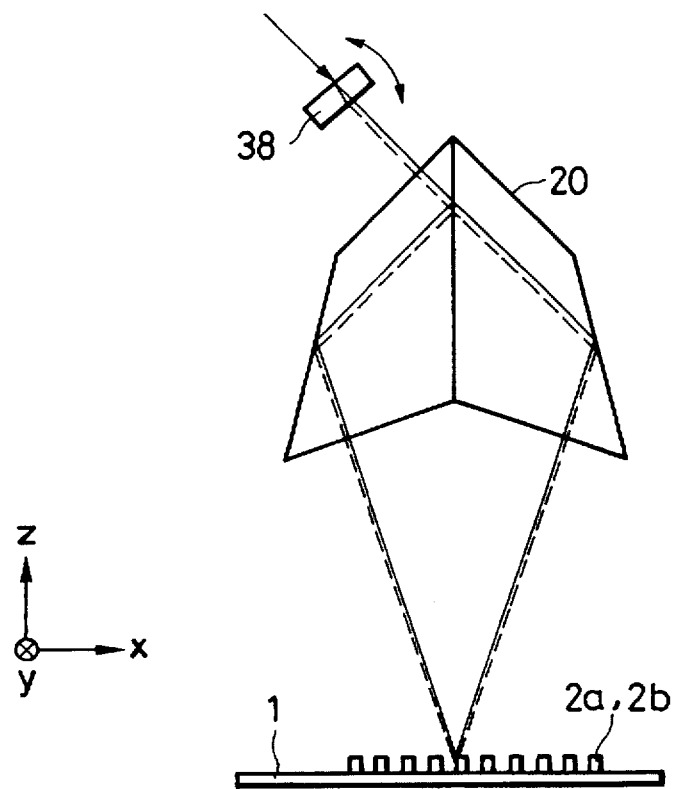
FIG. 14 illustrates a schematic view of the case in which a plane glass is used.

FIG. 14 illustrates another example of a method of driving the wafer in the z direction. Inclination of a plane glass 38 from a right angle with respect to the beam from source 3 causes the optical path shown by the broken line to shift on the wafer 1 in the z direction. Alternately, the illuminated point of the light beam can be shifted in the z direction by rotating the interference prism 20.

Regarding the detection and control of the rotational components σx, σy and σz of the diffraction gratings 2a and 2b, the tolerances for σx and σy are large while the tolerance for σz is up to 10" and is very small, as shown in FIG. 1. Therefore, alignment control of the rotational components of the diffraction gratings 2a and 2b is mainly done for σz.

Figure 15:
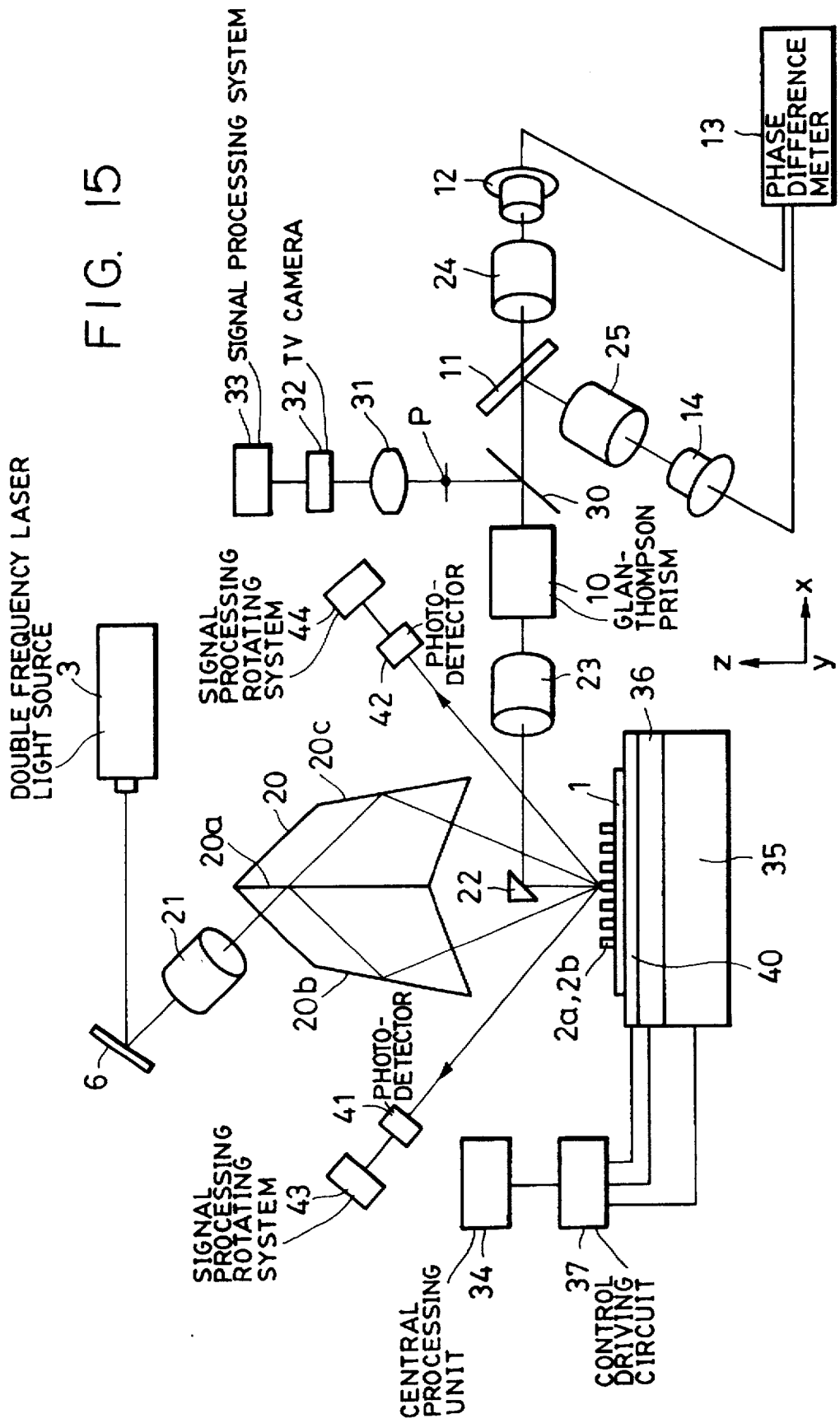
FIG. 15 illustrates a schematic view of another embodiment of the present invention.

The detection method used for controlling σz will be described with reference to FIG. 15. Elements identical to those shown in FIG. 10 are denoted by identical reference numerals. In an embodiment shown in FIG. 15, the wafer 1 is placed on a in-plane rotation mechanism 40. Photodetectors 41 and 42, which may be two-dimensional sensors, detect variations in the position of the light spot of the light beam having a diffraction order other than a desired order used for producing interference light beams S1 and S2 (which is the light beam incident on the photodetectors 12 and 14 through the mirror 22), e.g., the diffracted light of the second order produced by the diffraction gratings 2a and 2b, from the diffracted light beams incident on the diffraction gratings 2a and 2b on the wafer 1.

The inclination δz of the wafer 1 can be obtained by detecting the shift of the light spot from the position of the diffracted light obtained by normal wafer alignment by means of the photodetectors 41 and 42. If the photodetectors 41 and 42 are disposed at a point separated from the illuminated point of the light spot on the wafer 1 by 100 mm and if the position detection ability or resolution of the photodetectors 41 and 42 is 2 μm, 0.002 mm/100 mm=0.02= 4". Therefore, the performance of the photodetectors 41 and 42 is sufficient so as to act as a monitor which detects a maximum acceptable deviation of up to 10".

Figure 16:
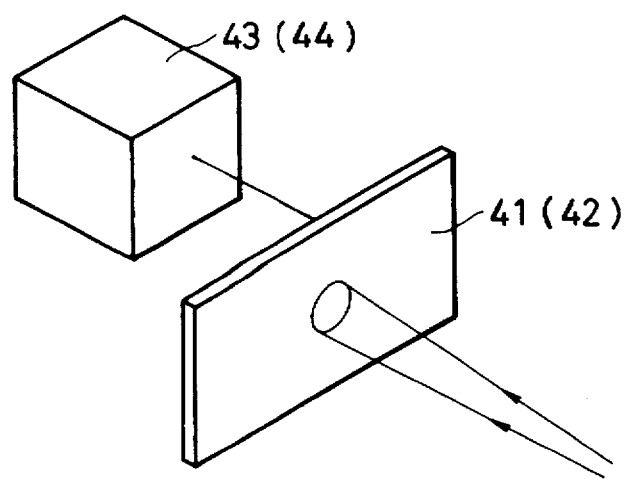
FIG. 16 is a perspective view of a photodetector and a signal processing system.

As shown in FIG. 16, the photodetectors 41 and 42 are connected to signal processing rotating systems 43 and 43, respectively. The output signals of the signal processing systems 43 and 44 are supplied to the CPU 34. A grating sample can be set within a desired tolerance for σz by rotating the in-plane rotating mechanism 40 of the wafer 1 on the basis of the obtained amount of rotation σz. In addition to the diffracted light beams of the second and higher orders produced by the diffraction gratings 2a and 2b, diffracted light of the first order may be employed as long as it is not used for measurement of the positional deviation between the gratings. In the structure shown in FIG. 15, however, since the diffracted light of the first order may overlap the light of the zeroth order, i.e., the regularly reflected light, the use of diffracted light of a second or higher order is desirable. In general, there is no limitation to the order of the diffracted light and a light beam of any diffraction order which is sensitive to the rotation of the diffraction grating can be employed. Furthermore, four-part sensors may be used as the position detection sensors in place of the photodetectors 41 and 42.

As will be understood from the foregoing description, in the positional deviation measuring device according to the present invention, the diffracted light beams emanating from the two grating patterns on the same object are caused to interfere with each other, and the positional deviation between the grating patterns is measured by obtaining the phase difference between the two interference light beams. Consequently, the relationship between the illumination optical system and the object can be obtained within the maximum acceptable deviation, and the detection accuracy can thus be enhanced.

The individual components represented by the blocks shown in FIGS. 4, 9, 10 and 15 are well known in the positional deviation measuring art and their specific construction and operation is not critical to the invention or the best mode for carrying out the invention. Therefore, no further description thereof is deemed necessary.

What is claimed is:

1. A device for measuring the positional deviation between a plurality of diffraction gratings formed on the same object, said device comprising:

an illumination optical system for illuminating the plurality of diffraction gratings with a light beam, the illumination by said illumination optical system generating a plurality of diffracted light beams from the plurality of diffraction gratings;

an interference optical system for forming at least one interference light beam from the plurality of diffracted light beams;

a detector for detecting the at least one interference light beam, wherein the result of the detecting by said detector serves as the basis for measuring the positional deviation between the plurality of diffraction gratings;

a signal processing system configured to measure the relative positional relation between said illumination optical system and the plurality of diffraction gratings, in a rotation direction about the z-axis in accordance with light reflected by the diffraction gratings incident on the signal processing system; and a control driving circuit connected to a stage supporting the object and configured to align said illumination optical system with the object on the basis of the measuring by said signal processing system so as to obtain the one color condition between the diffracted light beams.

2. The positional deviation measuring device according to claim 1, wherein the plurality of diffraction gratings are two equidistant linear diffraction gratings.

3. The positional deviation measuring device according to claim 2, wherein said interference optical system forms two separate interference light beams from the diffracted light beams respectively generated from the two diffraction gratings.

4. The positional deviation measuring device according to claim 1, wherein said measuring system comprises imaging means for imaging the plurality of diffraction gratings through said interference optical system.

5. The positional deviation measuring device according to claim 1, wherein said measuring system comprises:

a light-receiving element for receiving a diffracted light beam which is generated from the at least one of the plurality of diffraction gratings by the illumination of said illumination optical system, wherein the relative positional relation between said interference optical system and the plurality of diffraction gratings is measured from a position on said light-receiving element at which the diffracted light beam is incident.

6. The positional deviation measuring device according to claim 5, wherein said measuring system measures the rotational positional deviation about a direction perpendicular to the surface on which the object on which the plurality of diffraction gratings are formed.

7. A method of measuring the positional deviation between a plurality of diffraction gratings formed on the same object, said method comprising the steps of:

illuminating the plurality of diffraction gratings with a light beam from an illumination optical system, the illumination generating a plurality of diffracted light beams from the plurality of diffraction gratings;

forming at least one interference light beam from the plurality of diffracted light beams using an interference optical system;

detecting the at least one interference light beam, and using the result of said detecting to measure the positional deviation between the plurality of diffraction gratings;

measuring with a signal processing system the relative positional relation between the illumination optical system and the plurality of diffraction gratings, in a rotation direction about the z-axis, in accordance with light reflected by the diffraction gratings incident on the signal processing system; and aligning the illumination optical system with the object with a control driving circuit on the basis of the results of said measuring step, so as to obtain the one color condition between the diffracted light beams, said illumination in said illuminating step being performed on the plurality of diffraction gratings which have been aligned in said alignment step.

8. The positional deviation measuring method according to claim 7, wherein the plurality of diffraction gratings are two equidistant linear diffraction gratings.

9. The positional deviation measuring method according to claim 8, further comprising the step of forming separate interference light beams from the diffracted light beams respectively generated from the two diffraction gratings with the interference optical system.

10. The positional deviation measuring method according to claim 7, wherein said measuring step comprises the step of using imaging means for imaging the plurality of diffraction gratings through the interference optical system.

11. The positional deviation measuring method according to claim 7, wherein said measuring step further comprises the steps of:

receiving a diffracted light beam, which is generated from the at least one of the plurality of diffraction gratings by the illumination of the illumination optical system, with a light receiving element; and measuring the relative positional relation between the interference optical system and the plurality of diffraction gratings from a position on the light-receiving element at which the diffracted light beam, is incident.

12. The positional deviation measuring method according to claim 11, wherein said measuring step comprises the step of measuring the rotational positional deviation about a direction perpendicular to the surface of the object on which the plurality of diffraction gratings are formed.

13. A device according to claim 1, wherein said control driving circuit aligns the illumination optical system with the object in a rotation direction around the z-axis within a tolerance of 0.05 m rad.

14. A method according to claim 7, wherein said aligning step aligns the illumination optical system with the object in a rotation direction about the z-axis within a tolerance of 0.05 m rad.

* * * * *

UNITED STATES PATENT AND TRADEMARK OFFICE
CERTIFICATE OF CORRECTION

PATENT NO.   : 5,751,426

DATED        : May 12, 1998

INVENTOR(S)  : Noriyuki NOSE, et al.

It is certified that error appears in the above-identified patent and that said Letters Patent is hereby corrected as shown below:

ON THE COVER PAGE:

AT [75] Inventors:

"Higashinakano" should read --Tokyo--.

COLUMN 5:

Line 3, "100 a" should read --φa--.
   Line 25, "φf1)" should read --φ0f1)--.
   Line 27, "'Bf2 cos" should read --Bf2 cos--.

COLUMN 9:

Line 20, "generation" should read --generation of--.

COLUMN 10:

Line 51, "3.7" should read --3.7°--

UNITED STATES PATENT AND TRADEMARK OFFICE
CERTIFICATE OF CORRECTION

PATENT NO. : 5,751,426

DATED : May 12, 1998

INVENTOR(S) : Noriyuki NOSE, et al.

It is certified that error appears in the above-identified patent and that said Letters Patent is hereby corrected as shown below:

COLUMN 13:

Line 43, "and 43," should read --and 44,--.

COLUMN 16:

Line 19, "beam," should read --beam--.

Signed and Sealed this

Sixth Day of April, 1999

Attest:

Q. TODD DICKINSON

Attesting Officer

Acting Commissioner of Patents and Trademarks